United States Patent [19]

Horng

[11] Patent Number: 5,873,406
[45] Date of Patent: Feb. 23, 1999

[54] HEAT DISSIPATION DEVICE

[75] Inventor: Alex Horng, Kaohsiung, Taiwan

[73] Assignee: Sunonwealth Electric Machine Industry Co., Ltd., Taiwan

[21] Appl. No.: 966,782

[22] Filed: Nov. 10, 1997

[51] Int. Cl.[6] .................................................. H05K 7/20
[52] U.S. Cl. ........................ 165/80.3; 165/121; 361/697
[58] Field of Search .................. 165/80.3, 121, 165/185; 361/695, 697, 704

[56] References Cited

U.S. PATENT DOCUMENTS

| | | | |
|---|---|---|---|
| 4,327,398 | 4/1982 | Christison | 361/695 |
| 5,299,632 | 4/1994 | Lee . | |
| 5,309,983 | 5/1994 | Bailey . | |
| 5,421,402 | 6/1995 | Lin | 165/80.3 |
| 5,486,981 | 1/1996 | Blomquist | 361/704 |
| 5,522,200 | 6/1996 | Hong | 165/80.3 X |
| 5,582,506 | 12/1996 | Hong | 165/80.3 X |
| 5,602,719 | 2/1997 | Kinion | 361/704 |
| 5,690,468 | 11/1997 | Hong | 165/80.3 X |
| 5,701,951 | 12/1997 | Jean | 165/121 |
| 5,734,553 | 3/1998 | Hong | 361/697 |

*Primary Examiner*—Leonard R. Leo
*Attorney, Agent, or Firm*—Pillsbury Madison & Sutro LLP

[57] ABSTRACT

A heat dissipation device for the central processing unit (CPU) with larger area mainly comprises a finned plate and a board member mounted to the finned plate. The finned plate includes a plurality of rows and/or columns of fins extending upwardly from an upper side, wherein gaps are formed among every adjacent fins for the purpose of air circulation, and two separable grooves are defined among every adjacent fin block. The board member includes a hole, and a support member provided in the hole and connected to the periphery defining the hole by a plurality of ribs extending to the support member. A stud is formed on an upper side of the support member and includes a second hole defined therein for rotationally receiving a rotor shaft of fan. At lease one holder is provided at the grooves for mounting the heat dissipation device onto the central processing unit.

2 Claims, 12 Drawing Sheets

5,873,406

HEAT DISSIPATION DEVICE

BACKGROUND OF THE INVENTION

1. Field of the Invention

The present invention relates to a heat dissipation device, and more particularly to, a heat dissipation device for the central processing unit with larger area.

2. Description of the Related Art

Heat dissipation is an important factor to performance of central processing unit (CPU). Although a wide variety of cooling devices have been provided, the effects thereof are not satisfactory in every respect. For example, U.S. Pat. No. 5,299,632 issued to Lee on Apr. 5, 1994 and U.S. Pat. No. 5,309,983 issued to Bailey on May 10, 1994 disclose heat dissipating devices comprising a fan assembly with relatively large volume and thus cannot be used in a portable computers. Furthermore, it has been found that dust tends to a accumulate in the cooling device or other elements, resulting in malfunction of the fan as well as noise of the fan. Besides, the amount of cool air induced by conventional heat dissipation device is not maximized for larger CPU. Accordingly, it has been taught to combine two or more cooling devices in one assembly to solve this problem. The present invention is intended to provide an improved design to mitigates and/or obviates the above problem.

SUMMARY OF THE INVENTION

The main object of the present invention is to provide a heat dissipation device for the central processing unit (CPU) with larger area.

Another object of the present invention is to provide a heat dissipation device having a holder for mounting the heat dissipation device to the CPU.

According to the present invention, the heat dissipation device for the central processing unit (CPU) with larger area mainly comprises a finned plate and a board member mounted to the finned plate. The finned plate includes a plurality of rows and/or columns of fins extending upwardly from an upper side, wherein gaps are formed among every adjacent fins for the purpose of air circulation, and two separable grooves are defined among every adjacent fin block. The board member includes a hole, and a support member provided in the hole and connected to the periphery defining the hole by a plurality of ribs extending to the support member. A stud is formed on an upper side of the support member and includes a second hole defined therein for rotationally receiving a rotor shaft of the fan. At lease one holder is provided at the grooves for mounting the heat dissipation device onto the central processing unit.

In accordance with one aspect of the invention, the board member further includes sidewalls extending downwardly from the edges of board member to enclose the finned plate for enhancing the air circulation.

In accordance with another aspect of the invention, at lease one holder is provided at the grooves for mounting the heat dissipation device onto the central processing unit.

Other objects, advantages, and novel features of the invention will become more apparent from the following detailed description when taken in conjunction with the accompanying drawings.

DESCRIPTION OF THE PREFERRED EMBODIMENT

Figure 1:
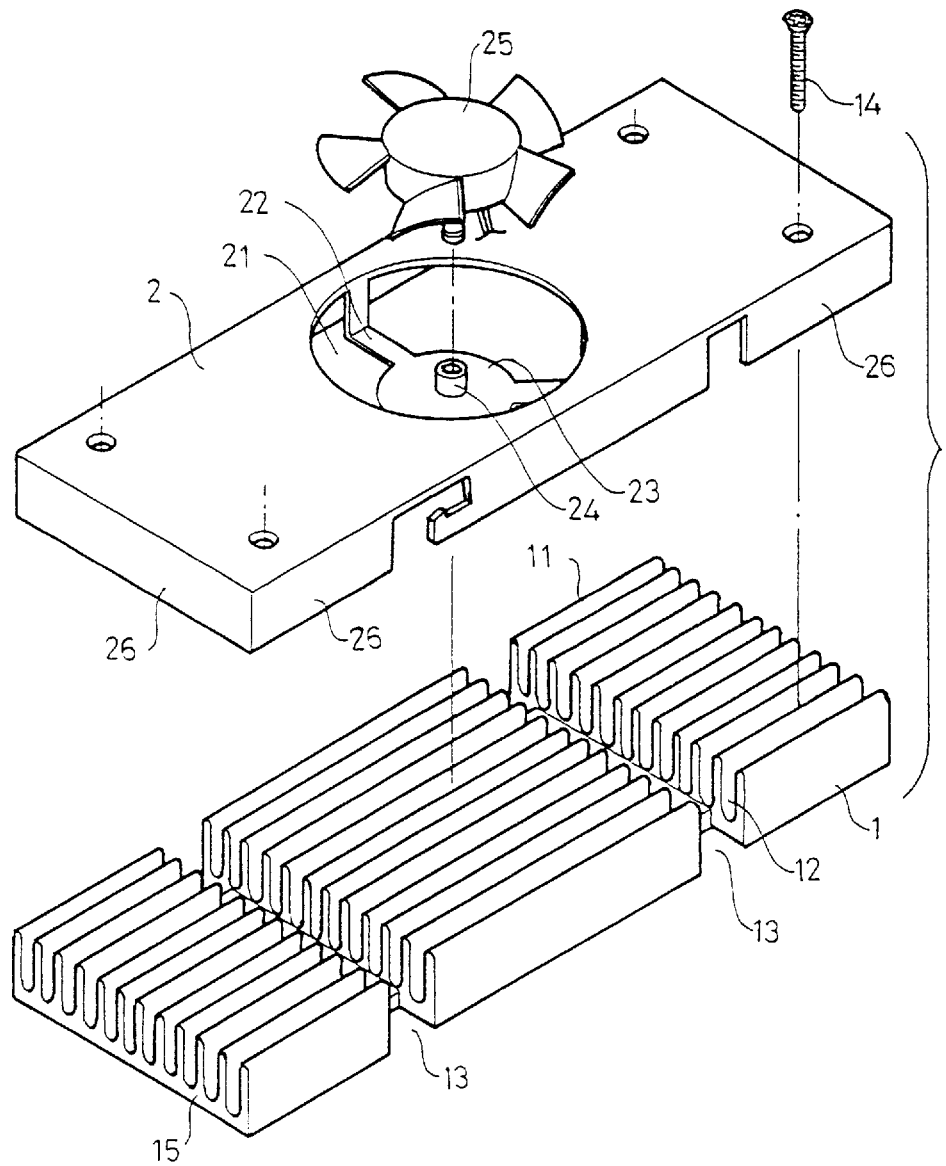
FIG. 1 is an exploded perspective view of a first embodiment of a heat dissipation device for the central processing unit (CPU) with larger area in accordance with the present invention.

Referring to the drawings and initially to FIGS. 1, 5, 9, 14, the heat dissipation device for the central processing unit (CPU) with larger area in accordance with the present invention mainly comprises a finned plate 1 and a board member 2 mounted onto the finned plate 1. The finned plate 1 is made of materials having excellent heat dissipation characteristics, such as aluminum. The finned plate 1 includes a plurality of rows and/or columns of fins 11 extending upwardly from an upper side of the finned plate 1, wherein gaps 12 are formed among every adjacent fins 11 for the purpose of air circulation, and two separable grooves 13 are defined among every adjacent fin block 15. Preferably, the fins 14 are integral with the finned plate 1 and made of the same material. The board member 2 includes a hole 21 defined in an appropriate portion thereof, and a support member 23 provided in the hole 21 and connected to the periphery defining the hole 21 by a plurality of ribs 22 extending to the support member 23. A stud 24 is formed on an upper side of the support member 23 and includes a second hole (not labeled) defined therein for rotationally receiving a rotor shaft of the fan 25. Accordingly, the heat dissipation device forms a larger heat transfer surfaces to match with larger size CPU or combination of several smaller CPU.

Figure 2:
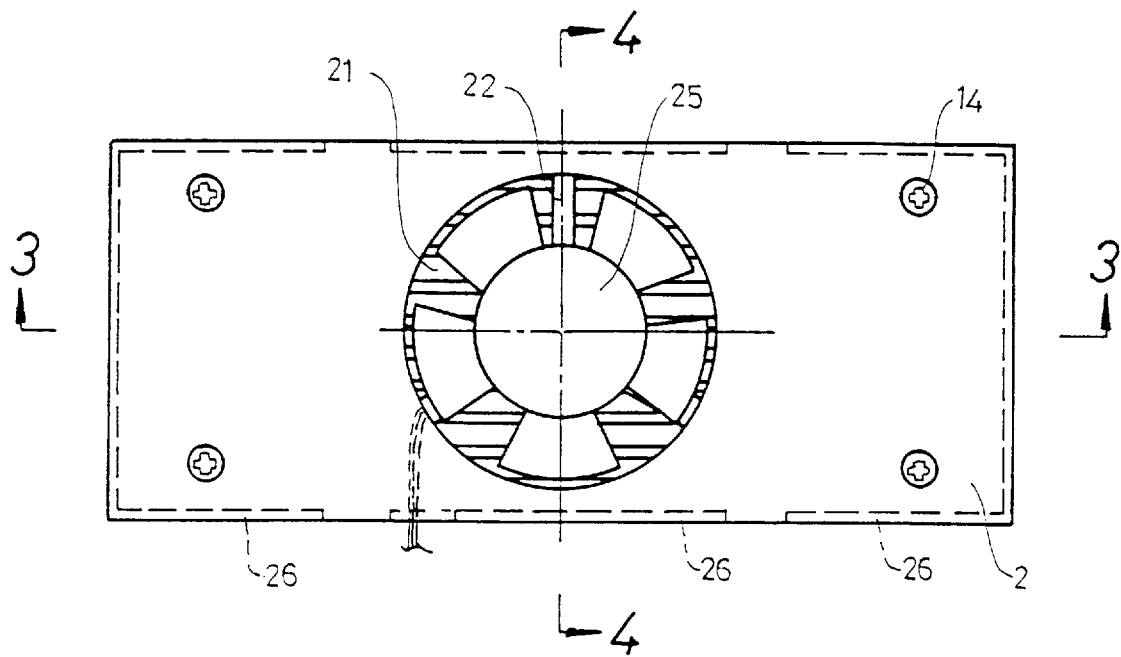
FIG. 2 is a top plan view of the assembled fan device in FIG. 1.
Figure 3:
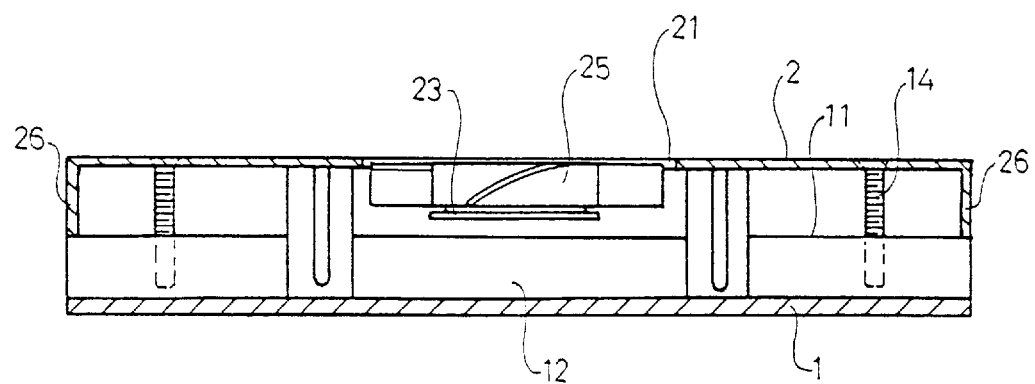
FIG. 3 is a cross-sectional view taken along line 3—3 in FIG. 2.
Figure 4:
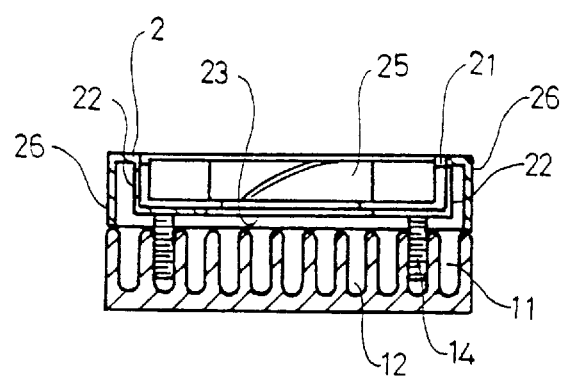
FIG. 4 is a cross-sectional view taken along line 4—4 in FIG. 2.
Figure 5:
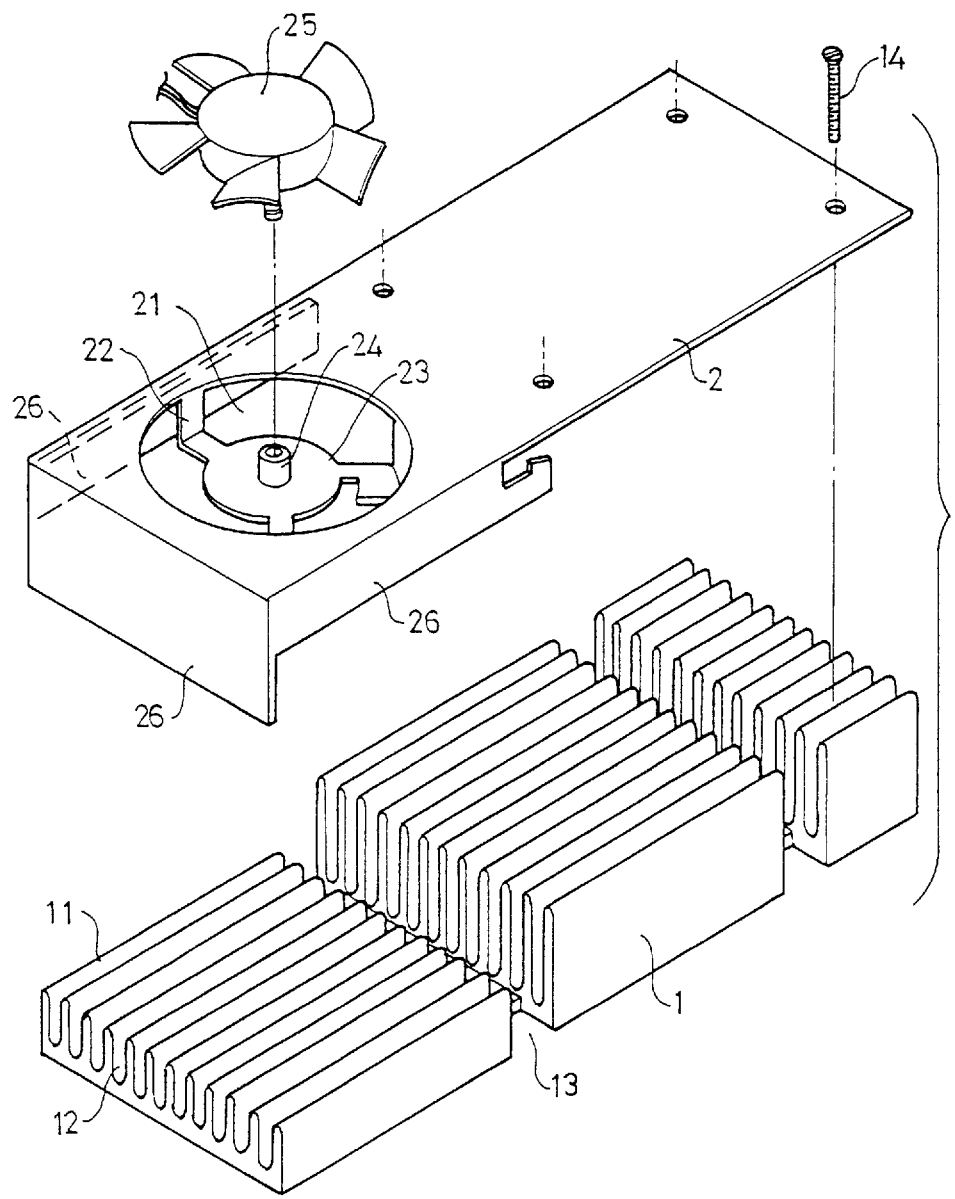
FIG. 5 is an exploded perspective view of a second embodiment of a heat dissipation device for the central processing unit (CPU) with larger area in accordance with the present invention.
Figure 6:
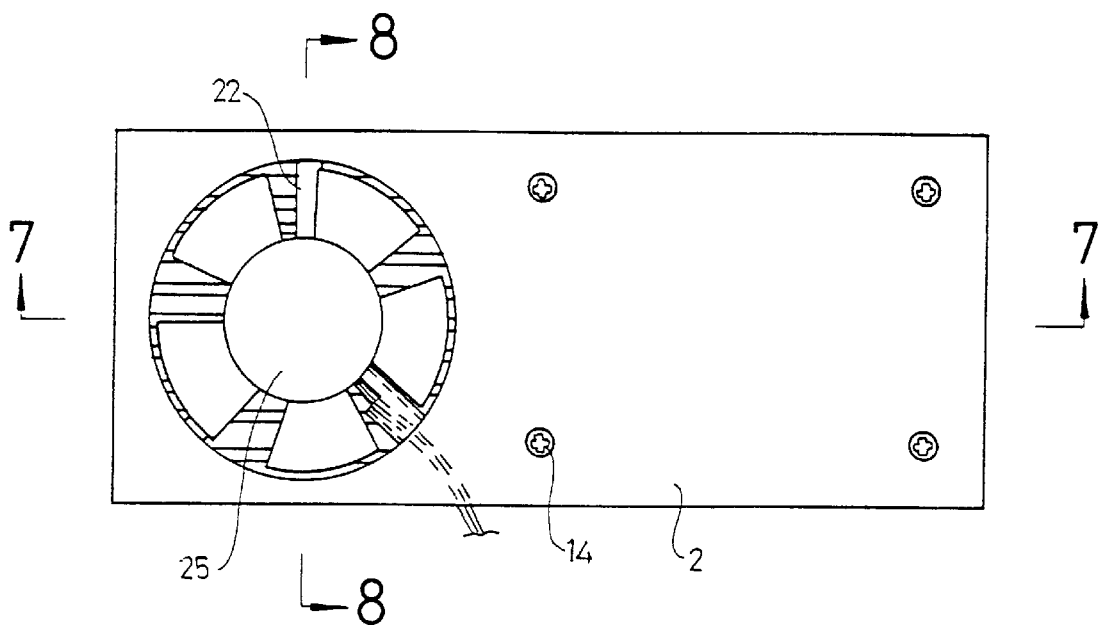
FIG. 6 is a top plan view of the assembled fan device in FIG. 5.
Figure 7:
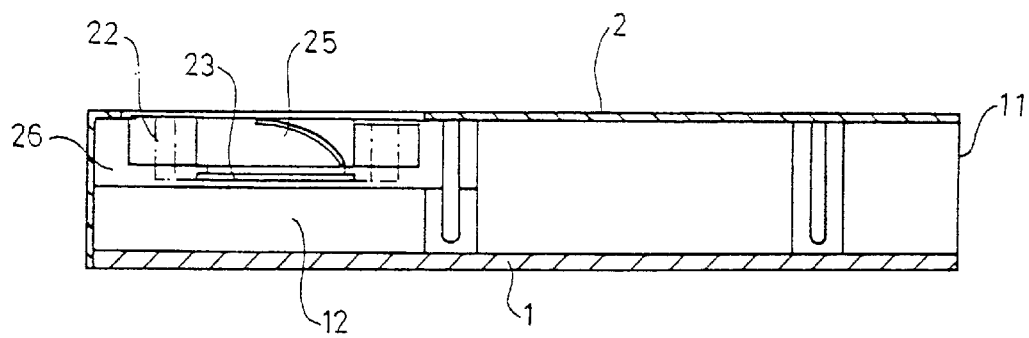
FIG. 7 is a cross-sectional view taken along line 7—7 in FIG. 6.
Figure 8:
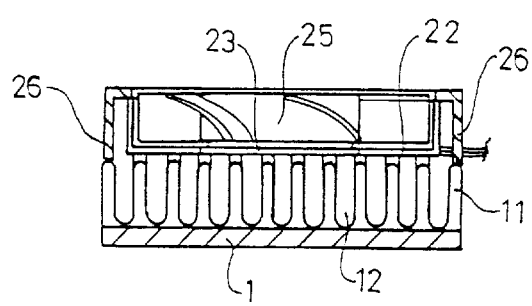
FIG. 8 is a cross-sectional view taken along line 8—8 in FIG. 6.
Figure 9:
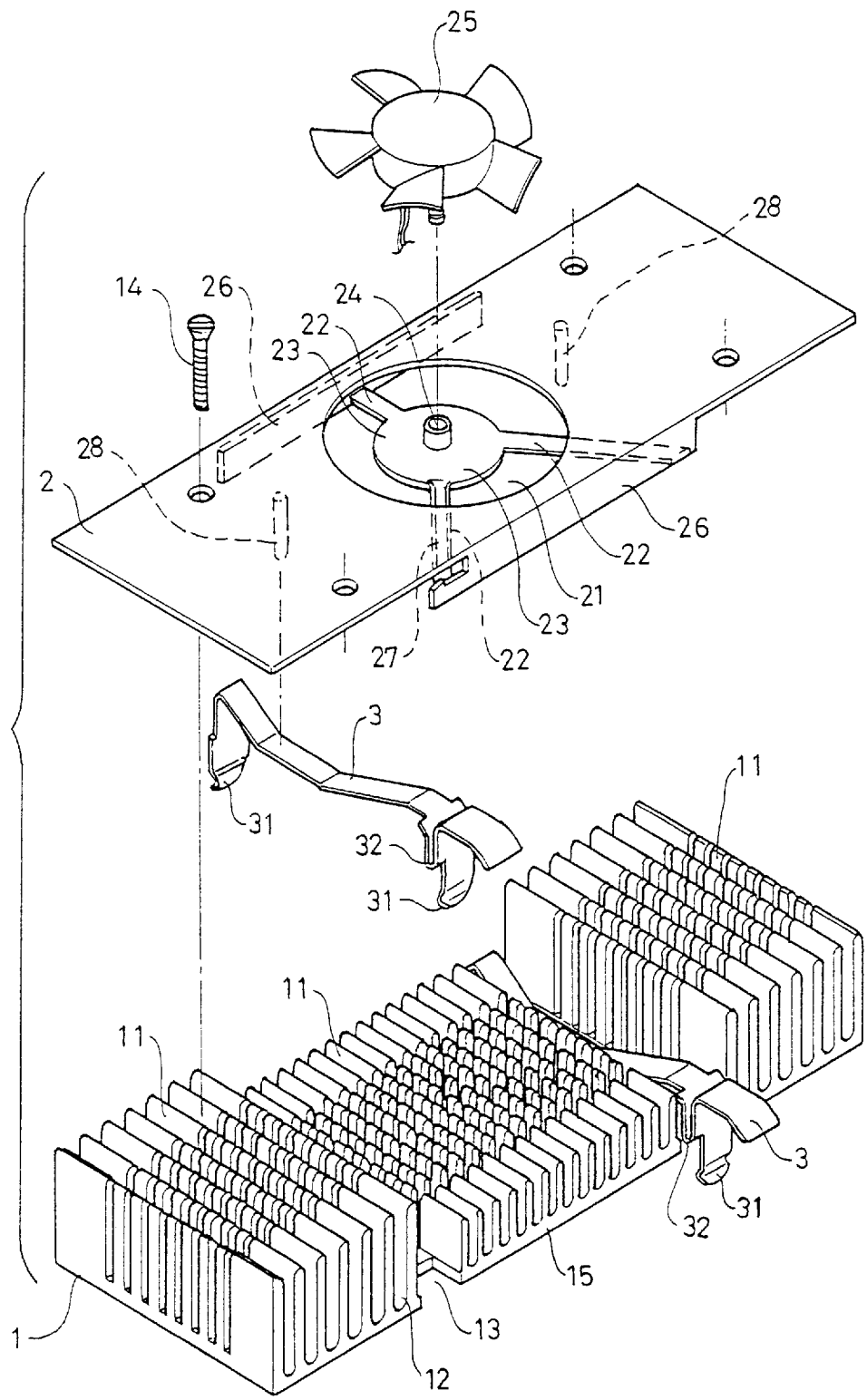
FIG. 9 is an exploded perspective view of a third embodiment of a heat dissipation device for the central processing unit (CPU) with larger area in accordance with the present invention.
Figure 10:
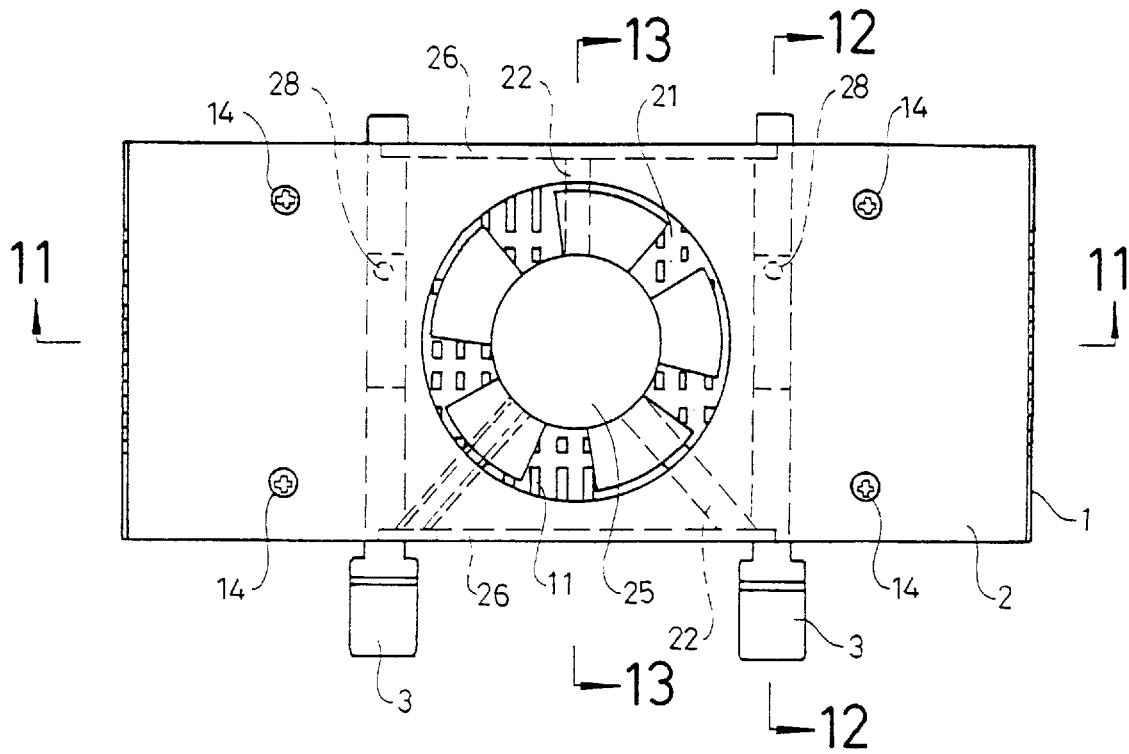
FIG. 10 is a top plan view of the assembled fan device in FIG. 9.
Figure 11:
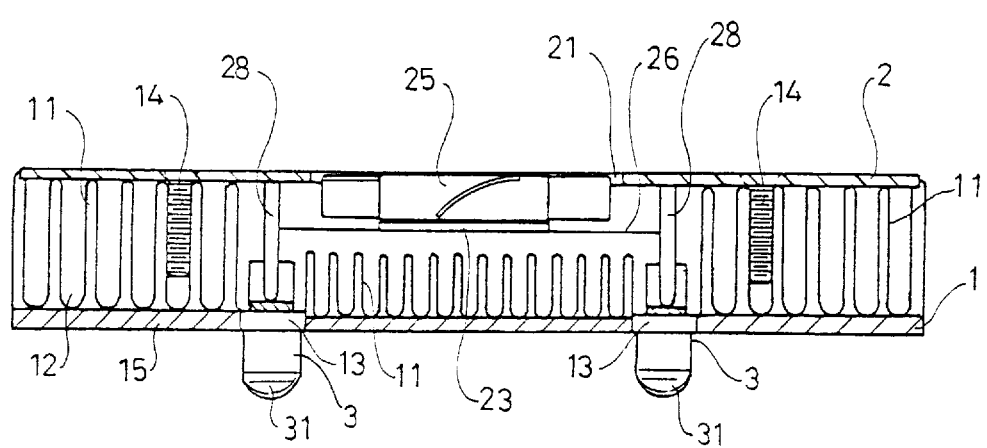
FIG. 11 is a cross-sectional view taken along line 11—11 in FIG. 10.
Figure 12:
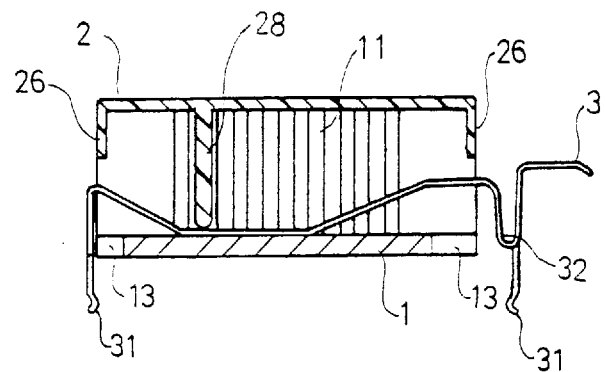
FIG. 12 is a cross-sectional view taken along line 12—12 in FIG. 10.
Figure 13:
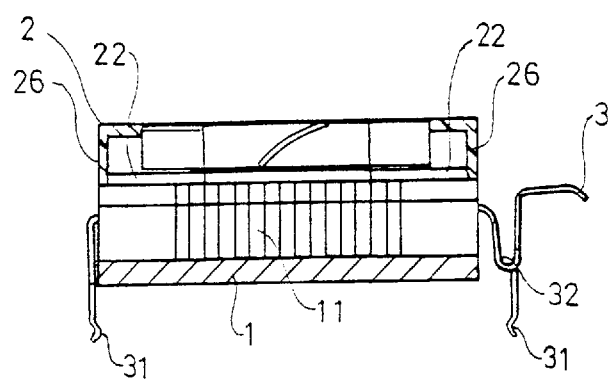
FIG. 13 is a cross-sectional view taken along line 13—13 in FIG. 10.
Figure 14:
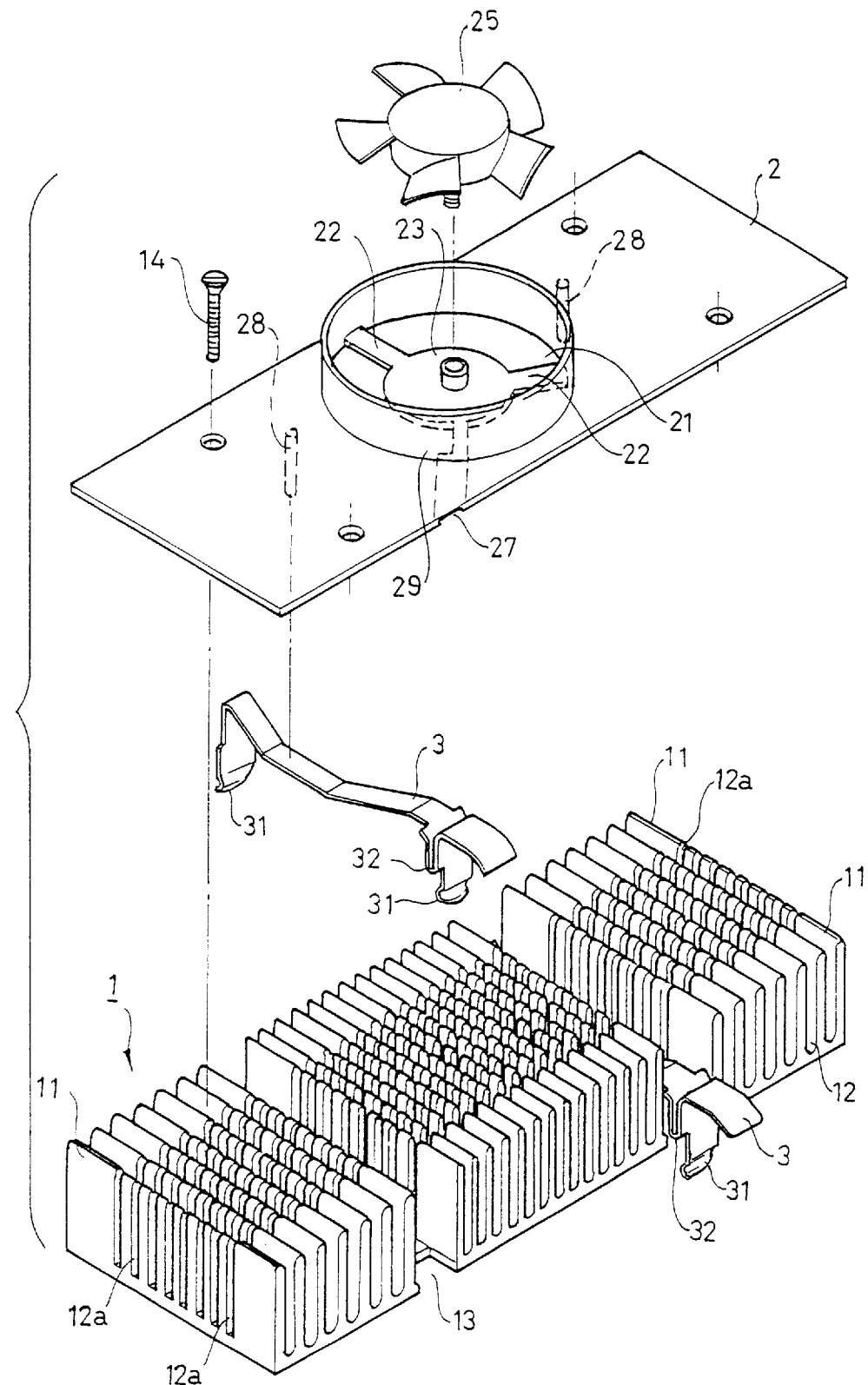
FIG. 14 is an exploded perspective view of a fourth embodiment of a heat dissipation device for the central processing unit (CPU) with larger area in accordance with the present invention.

According to the first preferred embodiment of the present invention, as shown in FIGS. 2, 3 and 4, when the finned plate 1 is mounted on the board member 2, the underside of the board member 2 fittingly and securely contacts the top of each fin 11 of the finned plate 1. Then, the finned plate 1 and the board member 2 can be assembled securely by fasteners 14, such as screws. The board member 2 further includes sidewalls 26 extending downwardly from the edges of board member 2 to enclose the four sides of the finned plate 1. The sidewalls 26 enclose all the fins 11 of finned plate 1, which limits the air flow induced by the fan 25 to flow inside enclosed area among the gaps 12 of all fins 11 so as to provide a better heat dissipating effect.

Now refer to the second preferred embodiment in accordance with the present invention as shown in FIGS. 5, 6, 7 and 8. The hole 21 is disposed at the left side of the board member 2, and the height of the left fins block 15 corresponding to the hole 21 is lower than the other fin blocks 15. The sidewalls 26 merely enclose the left side fin block 15. According to this embodiment, the air flow induced by the fan 25 flows from the left side to the right side through the gaps 12 among the fins 11 to achieve a better heat dissipating effect.

Referring to FIGS. 9 through 13, which illustrate the third embodiment in accordance with the present invention. The heat dissipation device for the central processing unit (CPU) with larger area of the present invention mainly comprises a finned plate 1, a board member 2 mounted to the finned plate 1, and a holder 3. The finned plate 1 includes a plurality of rows and/or columns of fins 11 extending upwardly from an upper side, wherein gaps 12 are formed among every adjacent fins 11 for the purpose of air circulation, and two separable grooves 13 are defined among every adjacent fin block 15. Preferably, the fins 11 are integral with the finned plate 1 and made of the same material. The board member 2 includes a hole 21 defined in the central portion thereof, and a support member 23 provided in the hole 21 and connected by a plurality of ribs 22 extending from the support member 23 to the sidewalls 26. A stud 24 is formed on an upper side of the support member 23 and includes a second hole (not labeled) defined therein for rotationally receiving a rotor shaft of fan 25. The height of fin blocks corresponding to the hole 21 is lower than the other fin blocks. One of the ribs 22 has a slot 27 through which the electric wires of the fan 25 may extend to be connected to the electric power source.

A holder 3, such as a resilient sheet bar, is disposed at the grooves 13 for mounting the heat dissipation device onto the central processing unit. The holder 3 has two legs extending downwardly from both ends and terminating as two hooks 31. At least one fold 32 is provided adjacent to one leg of the holder 3 to provide a better spring effect for mounting the heat dissipation device onto the central processing unit. A rod 28 extends downwardly from the underside of the board member 2 to press against the holder 3 to position the holder 3 and to enhance the spring effect thereof FIGS. 14 to 18 depict the fourth embodiment of the heat dissipation device for the central processing unit (CPU) with larger area in accordance with the present invention, in which like elements are designated by like reference numerals of third embodiment. The board member 2 includes a hole 21 defined in an appropriate portion thereof, and a wall 29 extending upwardly from periphery of hole 21. A support member 23 provided in the hole 21 and connected by a plurality of ribs 22 extending from the support member 23 to the wall 29. A stud 24 is formed on an upper side of the support member 23 and includes a second hole (not labeled) defined therein for rotationally receiving a rotor shaft of fan 25. The three fin blocks 15 have the same height. Like the third embodiment, two holders 3 is provided at the grooves 13 for mounting the heat dissipation device onto the central processing unit.

Figure 15:
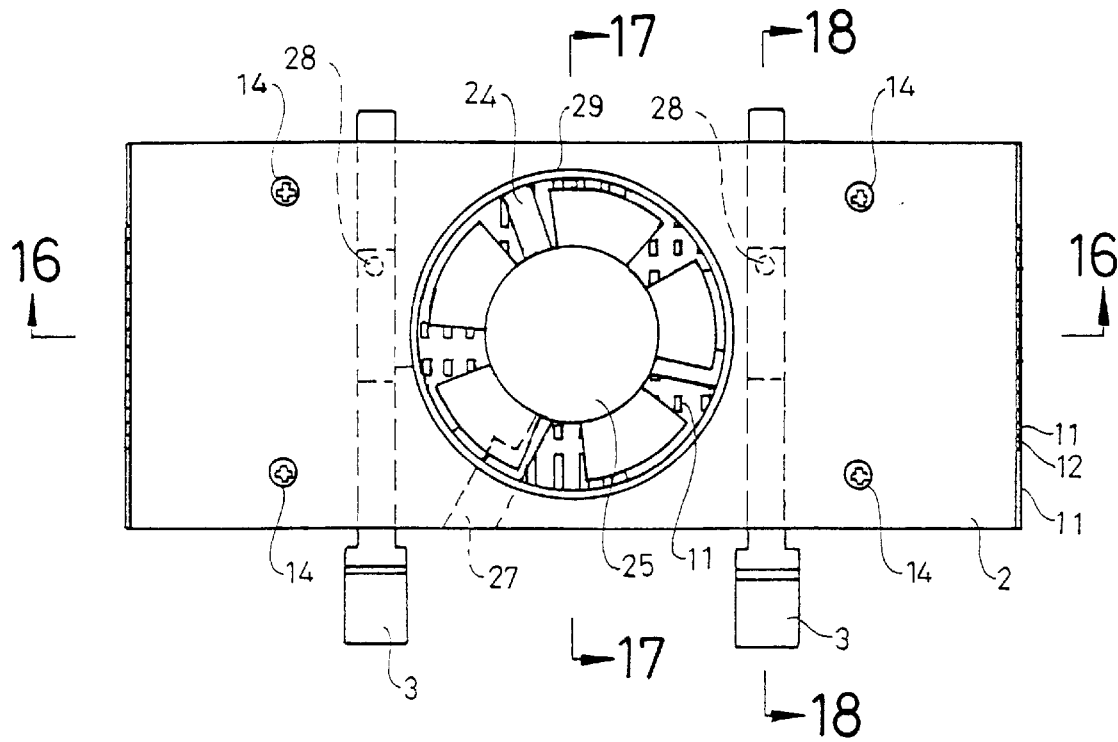
FIG. 15 is a top plan view of the assembled fan device in FIG. 14.
Figure 16:
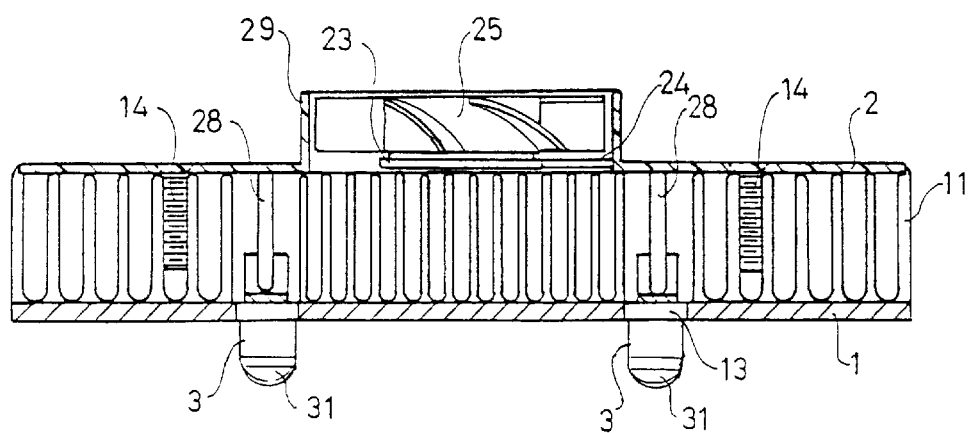
FIG. 16 is a cross-sectional view taken along line 16—16 in FIG. 15.
Figure 17:
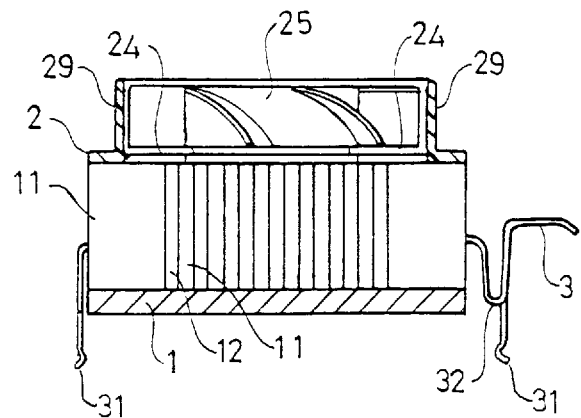
FIG. 17 is a cross-sectional view taken along line 17—17 in FIG. 15.
Figure 18:
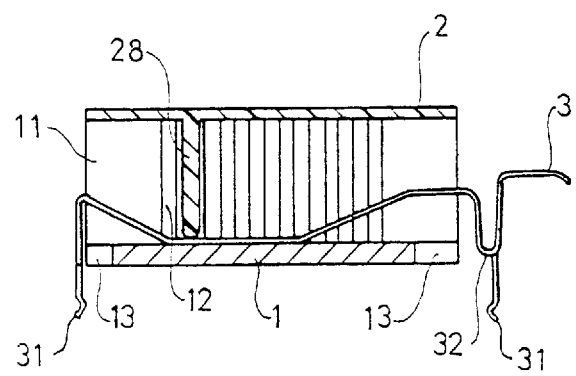
FIG. 18 is a cross-sectional view taken along line 18—18 in FIG. 15.
Figure 19:
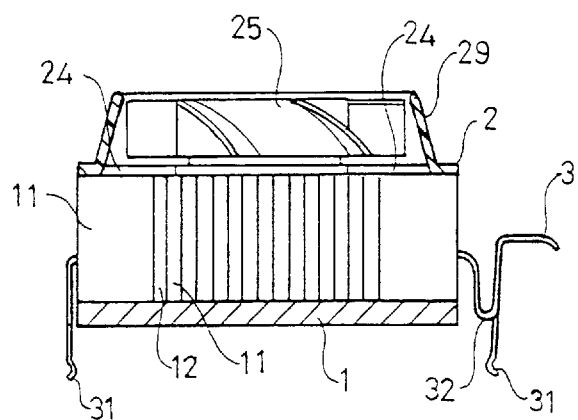
FIG. 19 is a cross-sectional view taken along line 17—17 in FIG. 15 of another embodiment.

Referring to FIG. 19, it illustrates a cross-sectional view taken along line 17—17 in FIG. 15 of another embodiment. According to this embodiment, the wall 29 extends inwardly from the hole 21 such that the top area of the wall is smaller than the bottom area thereof. Due to this configuration, more air cam be sucked by the fan 25 into the heat dissipation device.

Although the invention has been explained in relation to its preferred embodiment, it is to be understood that many other possible modifications and variations can be made without departing from the spirit and scope of the invention as hereinafter claimed.

What is claimed is:

1. A heat dissipation device comprising:

a finned plate having a plurality of fins extending in a first direction from an upper side thereof, every two adjacent fins having a gap defined therebetween;

a board member mounted on said finned plate having at least one rod extending in a second direction from an underside of said board member; and at least one holder having an end disposed at the gap between the two adjacent fins for mounting said heat dissipation device onto a circuit device, said holder having at least one leg extending in the second direction from the end terminating as a hook for hooking the integrated circuit device, at least one fold being provided adjacent to the leg of said holder to provide a better spring effect, the rod of said board member pressing against the holder to position the holder and to enhance the spring effect thereof.

2. The heat dissipation device according to claim 1, wherein said board member further comprises a side wall extending in the second direction from an edge of said board member to enclose said finned plate.

* * * * *